United States Patent [19]

Chen et al.

[11] Patent Number: 5,578,872
[45] Date of Patent: Nov. 26, 1996

[54] PLANAR CONTACT WITH A VOID

[75] Inventors: Fusen E. Chen, Milpitas, Calif.; Girish A. Dixit, Dallas; Robert O. Miller, The Colony, both of Tex.

[73] Assignee: SGS-Thomson Microelectronics, Inc., Carrollton, Tex.

[21] Appl. No.: 418,838

[22] Filed: Apr. 7, 1995

Related U.S. Application Data

[62] Division of Ser. No. 370,456, Jan. 9, 1995, which is a continuation of Ser. No. 919,948, Jul. 27, 1992, abandoned.

[51] Int. Cl.$^6$ .............................. H01L 29/41; H01L 29/43
[52] U.S. Cl. ......................... 257/751; 257/757; 257/763; 257/764; 257/773; 257/915
[58] Field of Search ................... 257/763, 764, 257/751, 757, 758, 773, 915, 750, 765

[56] References Cited

U.S. PATENT DOCUMENTS

| | | | |
|---|---|---|---|
| 4,502,210 | 3/1985 | Okumura et al. | 437/193 |
| 4,876,223 | 10/1989 | Yoda et al. | 437/228 |
| 4,884,123 | 11/1989 | Dixit et al. | 257/751 |
| 4,897,709 | 1/1990 | Yokoyama et al. | 437/190 |
| 4,920,071 | 4/1990 | Thomas | 437/190 |
| 4,960,732 | 10/1990 | Dixit et al. | 437/192 |
| 4,970,573 | 11/1990 | Roberts et al. | 357/71 |
| 5,104,826 | 4/1992 | Fujita et al. | 437/190 |

FOREIGN PATENT DOCUMENTS

| | | | |
|---|---|---|---|
| 0397131 | 11/1990 | European Pat. Off. | |
| 0430403 | 6/1991 | European Pat. Off. | 257/764 |
| 0453029 | 10/1991 | European Pat. Off. | |
| 0186038 | 9/1985 | Japan . | |
| 0250354 | 10/1990 | Japan | 437/190 |
| 0187244 | 8/1991 | Japan | 257/773 |
| 0201482 | 9/1991 | Japan | 257/915 |
| 0234935 | 9/1993 | Japan | 257/915 |

OTHER PUBLICATIONS

IBM TDB, vol. 30 No. 10, Mar. 1988, Reliable Tungsten Chemical Vapor Deposition Process with Sputter Etch to Form Contact Studs, pp. 162, 163.
Ellwanger, R. C. et al., "An Integrated Aluminum . . . ," Jun. 11–12, 1991 VMIC Conference, 1991 IEEE, pp. 41–50.
IBM Technical Disclosure Bulletin, vol. 22, No. 8A, Jan. 1980, Nitride–Limited Schottky Barrier Diode Design, F. H. Gaenssien, pp. 3397–3398.

*Primary Examiner*—Peter Toby Brown
*Attorney, Agent, or Firm*—Theodore E. Galanthay; Kenneth C. Hill; Lisa K. Jorgenson

[57] ABSTRACT

A method is provided for patterning a submicron semiconductor layer of an integrated circuit, and an integrated circuit formed according to the same. A first conductive structure is formed over the integrated circuit. A dielectric is formed over the first conductive structure having a contact opening exposing a portion of the underlying first conductive layer. A barrier layer is formed in the bottom of the contact opening. A second, substantially conformal conductive layer is formed by chemical vapor deposition over the dielectric layer; along the sidewalls and in the bottom of the contact opening. A third conductive layer is then formed over the second conductive layer wherein the third conductive layer does not fill the contact opening. The second and third conductive layers are etched to form an interconnect substantially over the contact opening.

21 Claims, 1 Drawing Sheet

PLANAR CONTACT WITH A VOID

This is a Division of Ser. No. 08/370,456, filed Jan. 9, 1995 and pending, which is a continuation of Ser. No. 07/919,948, filed Jul. 27, 1992 and now abandoned.

FIELD OF THE INVENTION

The present invention relates generally to semiconductor integrated circuit processing, and more specifically to an improved method of forming a planar contact opening with a void.

BACKGROUND OF THE INVENTION

The trend to continue to miniaturize semiconductor integrated circuits to achieve submicron feature sizes and increase the number of devices fabricated on the integrated circuit has required smaller isolation areas between devices. In addition, step coverage has posed a major problem for integrated circuit manufacturers even into the late 1980s. Poor step coverage can be found at the sharp vertical step metal to substrate contacts, metal to metal vias, and metal crossovers. As dimensions shrink, conventional techniques used to improve step coverage fall short of expectations and are limited to stringent design criteria.

Forming reliable submicron contacts for integrated circuit applications has received widespread attention in the microelectronics industry. Metal films, for example, are used extensively for surface wiring. The metallization process of wiring components together begins with etching contact openings or vias through the various layers down to the active regions within a semiconductor substrate, or to contact an underlying polycrystalline silicon or a metal interconnect layer. A conductive metal is then deposited over the surface of the wafer in a manner that provides good contact with the underlying active devices. Increasing chip density and smaller geometries have decreased the available area for surface wiring.

Because of its physical properties, aluminum is especially well suited for fabrication of metal interconnects. Among the properties which make aluminum so useful is the fact that it is very conductive, it forms a good mechanical bond with various dielectric layers generally used in the semiconductor industry, and it makes a good ohmic contact with both N and P type semiconductors. However, the sputtering process used to apply aluminum thin film layers to an integrated circuit generally results in less than ideal filling of contact vias. Large aluminum grains tend to form on the upper surface of the insulating layer. These grains which form at the edges of the contact via tend to block the contact opening before the aluminum has a chance to completely fill the contact via. This blockage produces a thinner layer of aluminum along the sides of the insulating layer, resulting in voids and uneven structures within the via. This blockage also leads to non-uniform current densities in the metal interconnect. This problem is enhanced as circuit devices are fabricated using smaller geometries.

The uneven thickness of the aluminum layer going into the via, caused by the step coverage problem described above, has an adverse impact on device functionality. If the voids in the via are large enough, contact resistance can be significantly higher than desired. In addition, the thinner regions of the aluminum layer will be subject to the well known electromigration problem. This problem can cause eventual open circuits at the contacts and premature failure of the devices. The devices must be designed so that the current density in the aluminum interconnect lines does not become high enough to cause rapid electromigration. The thinner regions of the aluminum layer tend to occur over abrupt height changes on the surface of the integrated circuit. Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common, however, as device sizes shrink because they consume too much area on a chip.

Even with these techniques, the problems of completely filling a via with aluminum are not solved. In part, this is due to the fact that aluminum is deposited at a temperature which tends to encourage fairly large grain sizes. Voids and other irregularities within the contact continue to be problems with current technologies.

It is therefore an object of this invention to provide a technique for manufacturing reliable submicron contacts for integrated circuits which meet smaller device geometry design requirements.

It is a further object of this invention to provide a method whereby contact openings are partially filled while capacitance remains low.

It would further be desirable to provide such a technique for increasing the planarity of the integrated circuit for deposited aluminum.

It is further desirable that such a technique be compatible with current standard process flows.

SUMMARY OF THE INVENTION

The invention may be incorporated into a method for forming a semiconductor device structure, and the semiconductor device structure formed thereby, by forming a contact opening in a dielectric layer exposing a portion of an underlying first conductive layer. A barrier layer is formed in the contact opening. A first conductive layer is formed over the dielectric layer; along the sidewalls and in the bottom of the contact opening. A second conductive layer is then formed over the first conductive layer wherein the second conductive layer does not fill the contact opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
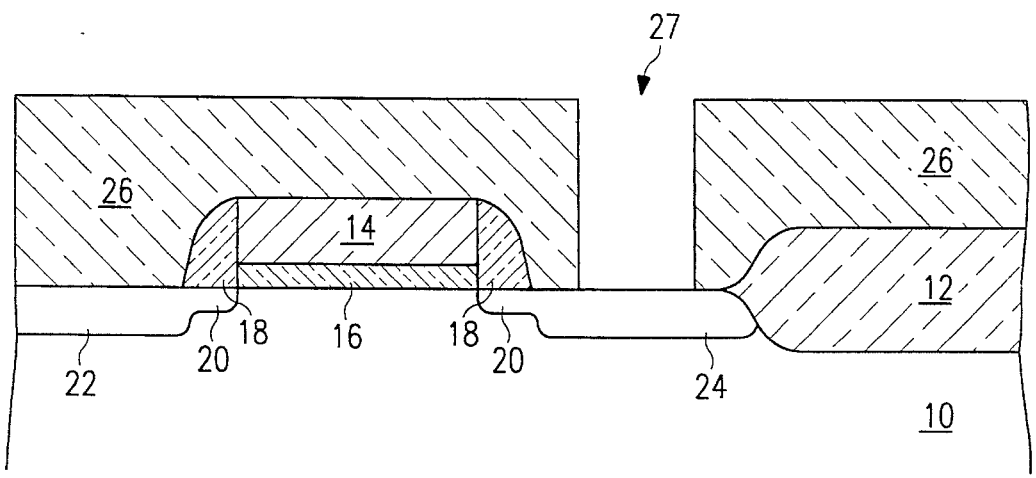
FIGS. 1–3 are cross-sectional views of the fabrication of a semiconductor device structure according to the present invention.

Referring to FIG. 1, an integrated circuit is to be formed on a silicon substrate 10. A field oxide region 12 is generally made in an area on the substrate as known in the art to separate active areas. A conductive structure such as a transistor is formed over a portion of the substrate 10. The transistor comprises gate electrode 14, preferably a doped polysilicon, which is formed over a gate oxide 16 as known in the art. The transistor typically also comprises oxide spacers 18, lightly doped drain regions 20 and more heavily doped source and drain regions 22, 24. An interlevel dielectric layer 26 is formed over the conductive structure and field oxide region. The dielectric layer 26 is typically borophosphorous silicate glass (BPSG) or other reflow type dielectric having a thickness of between approximately 2000 to 8000 angstroms. A contact opening 27 is formed in the dielectric layer 26, preferably by a dry, anisotropic etch to achieve substantially vertical sidewalls. The contact opening 27 exposes the underlying conductive structure which, in the preferred embodiment, is source/drain region 24.

Figure 2:
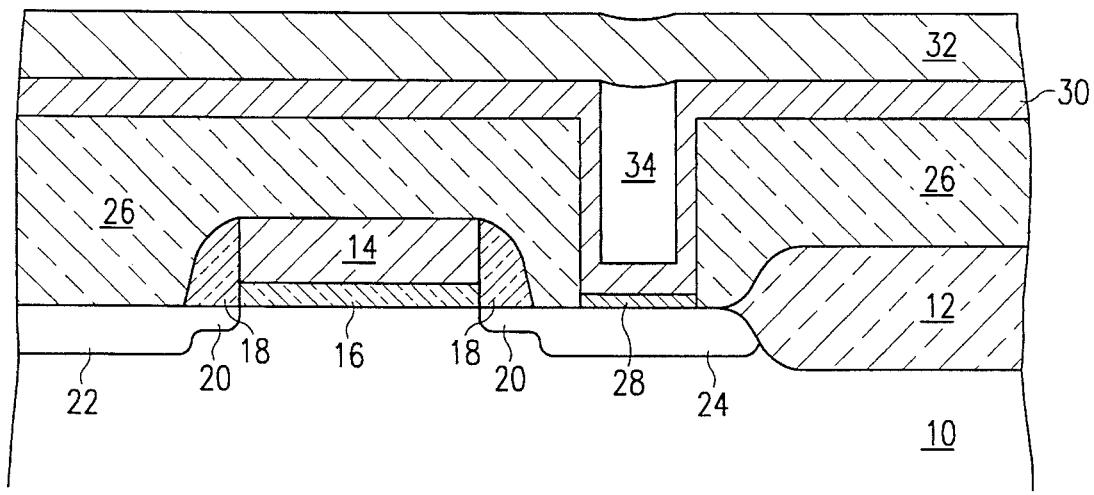

Referring to FIG. 2, a barrier layer 28 is formed in the bottom of the contact opening. Barrier layer 28 typically comprises a refractory metal or refractory metal nitride such as titanium or titanium nitride having a thickness of between approximately 300 to 2000 angstroms. The barrier layer 28 is generally formed by sputter deposition to reach the bottom of the opening, although some refractory metal may also form along the sidewalls of the opening and on top of the dielectric layer 26. At this point, the barrier layer 28 may be annealed to form a silicide in the bottom of the opening. A conformal conductive layer 30 is then formed over the dielectric layer 26, along the sidewalls of the opening and on the barrier layer 28 in the bottom of the opening. Conductive layer 30 is preferably a refractory metal or refractory metal silicide such as tungsten or tungsten silicide which are formed by chemical vapor deposition (CVD) to achieve adequate step coverage. Barrier layer 28 will provide adequate adhesion for the conductive layer 30 while preventing rapid interdiffusion of conductive layer 30 and source/drain region 24, or preventing catalyzed reactions involving, for example, tungsten and silicon.

In order to achieve the necessary small geometries, the width of the contact opening must be small; for example, it may have a height to width aspect ratio of 4:1. Therefore, the depth of the conductive layer 30 must also be limited. If, for example, the aspect ratio is 4:1, the depth of the conductive layer 30 is between approximately 500 to 1000 angstroms. The depth of conductive layer 30 on the dielectric 26 will approximate the width of the layer 30 on each sidewall, if the contact opening is filled with a CVD conductive layer, that is, the sidewalls meet at the aperture axis sealing up the contact opening, the depth of the conductive layer on the dielectric will be too thick, thus necessitating an etch back of the conductive layer before subsequent layers can be formed.

An upper conductive layer 32, preferably aluminum, is formed over the conductive layer 30. Since sputtered aluminum does not completely fill contact openings, if the width of the contact opening is made small, the aluminum will bridge across the contact opening. A void 34 is thus formed in the contact opening under the aluminum layer 32. The usual problems associated with voids, however, are not present in this invention. Particularly, moisture which may be trapped in the void can be removed by baking in situ in a vacuum before the aluminum layer 32 is formed. The resulting aluminum film 32 is nearly planar. The aluminum may thus be deposited at a relatively low temperature of between approximately 100°–400° C. since it is not desired to fill the contact opening. The aluminum is also not adjacent to or near the substrate due to the void which reduces the possibility of the aluminum alloying with silicon from the substrate and further reduces the possibility of junction spiking. The deposited aluminum, therefore, does not need silicon to be incorporated into it before deposition to prevent the alloying as in the case where the aluminum forms in the contact opening.

Figure 3:
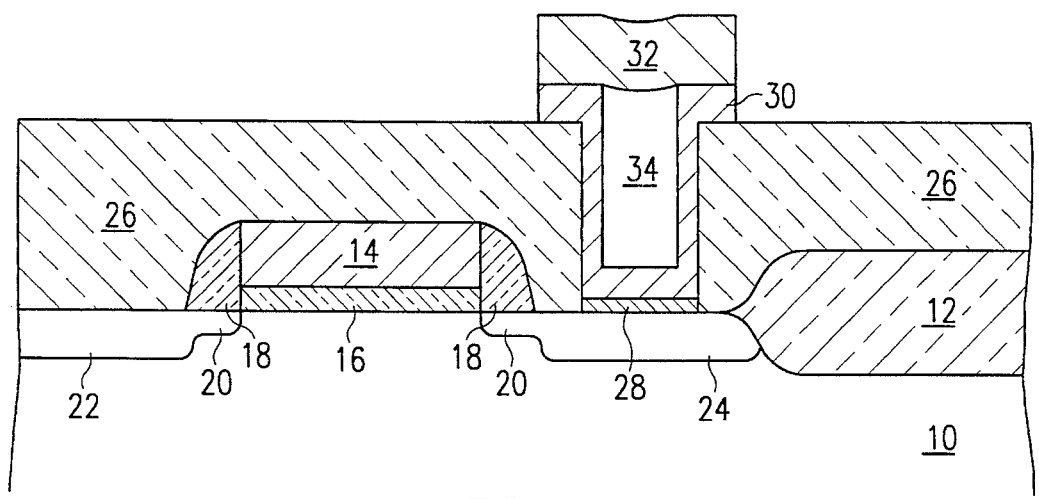

Referring to FIG. 3, the two conductive layers 30, 32 are etched to form an interconnect. Conductive layer 30 forms very little of the interconnecting line thickness while at the same time acts as a good conductor for current flow from the conductive layer 32 to the conductive structure 24. The relatively thin conductive layer 30 also allows for a substantially zero contact enclosure. The interconnect does not need to be much wider than the contact opening dimension. A considerable amount of layout space is thus saved.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor device, comprising:

a dielectric layer having a contact opening therethrough exposing a portion of an underlying conductive structure;

a barrier layer in the bottom of the contact opening;

a first conductive layer disposed over a portion of the dielectric layer, along the sidewalls of the contact opening and in the bottom of the opening; and a second conductive layer disposed over the first conductive layer wherein the second conductive layer does not fill the contact opening, leaving a void between the first and second conductive layers within the opening.

2. The structure of claim 1, wherein the contact opening is substantially moisture free.

3. The structure of claim 1, wherein the barrier layer comprises a refractory metal.

4. The structure of claim 3, wherein the refractory metal layer comprises titanium.

5. The structure of claim 1, wherein the barrier layer comprises a refractory metal nitride.

6. The structure of claim 5, wherein the refractory metal nitride layer comprises titanium nitride.

7. The structure of claim 1, wherein the first conductive layer is a chemical vapor deposited refractory metal.

8. The structure of claim 7, wherein the refractory metal comprises tungsten.

9. The structure of claim 1, wherein the second conductive layer comprises aluminum.

10. An interconnect structure in an integrated circuit device, comprising:

a conductive structure;

an insulating layer overlying the conductive structure and having an opening therethrough to expose a portion of the conductive structure;

a conformal conductive layer overlying the exposed portion of the conductive structure, sidewalls of the opening, and a portion of the insulating layer, wherein the conformal conductive layer has a thickness sufficient to define a space within the opening; and an aluminum layer on portions of the conformal conductive layer which overly the insulating layer, wherein the aluminum layer bridges over the opening to define a void, between the aluminum layer and the conformal conductive layer, in the opening;

wherein the conformal conductive layer and the aluminum layer are patterned to define interconnect.

11. The structure of claim 10, wherein the void is substantially moisture free.

12. The structure of claim 10, wherein the conformal conductive layer is a chemical vapor deposited refractory metal.

13. The structure of claim 12, wherein the refractory metal comprises tungsten.

14. The structure of claim 10, wherein the second conductive layer comprises aluminum.

15. The structure of claim 10, further comprising:

a barrier layer between the exposed portion of the conductive structure and the conformal conductive structure.

16. The structure of claim 15, wherein the barrier layer comprises a refractory metal.

17. The structure of claim 16, wherein the refractory metal layer comprises titanium.

18. The structure of claim 15, wherein the barrier layer comprises a refractory metal nitride.

19. The structure of claim 18, wherein the refractory metal layer comprises titanium nitride.

20. The structure of claim 10, wherein the conformal conductive layer comprises a refractory metal silicide.

21. The structure of claim 20, wherein the conformal conductive layer comprises tungsten silicide.

* * * * *